(12) United States Patent
Teh

(10) Patent No.: US 9,306,592 B2
(45) Date of Patent: Apr. 5, 2016

(54) SEMICONDUCTOR INTEGRATED CIRCUIT

(71) Applicant: Kabushiki Kaisha Toshiba, Minato-ku, Tokyo (JP)

(72) Inventor: Chen Kong Teh, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 103 days.

(21) Appl. No.: 14/159,917

(22) Filed: Jan. 21, 2014

(65) Prior Publication Data

US 2015/0015229 A1 Jan. 15, 2015

(30) Foreign Application Priority Data

Jul. 10, 2013 (JP) ................................. 2013-144839

(51) Int. Cl.
*G05F 1/575* (2006.01)
*H03M 1/36* (2006.01)
*H02M 3/157* (2006.01)

(52) U.S. Cl.
CPC .............. *H03M 1/368* (2013.01); *H02M 3/157* (2013.01)

(58) Field of Classification Search
CPC . H02M 3/157; H02M 3/1588; Y02B 70/1466
USPC .......... 323/222, 224, 282–289; 327/158, 536, 327/540
See application file for complete search history.

(56) References Cited

U.S. PATENT DOCUMENTS

| | | | | |
|---|---|---|---|---|
| 6,140,777 A | * | 10/2000 | Wang et al. | .................... 315/247 |
| 6,833,691 B2 | * | 12/2004 | Chapuis | .................. G06F 1/025 323/225 |
| 7,038,438 B2 | * | 5/2006 | Dwarakanath | ........ H02M 3/157 323/283 |
| 7,304,464 B2 | | 12/2007 | Weng et al. | |
| 7,595,686 B2 | * | 9/2009 | Maksimovic | ......... G04F 10/005 327/176 |
| 7,705,577 B2 | * | 4/2010 | Li et al. | .......................... 323/283 |
| 7,710,092 B2 | * | 5/2010 | Chapuis | ................ H02M 3/157 323/282 |
| 7,876,254 B2 | * | 1/2011 | Berens et al. | .................. 341/163 |
| 8,373,397 B2 | | 2/2013 | Tanifuji et al. | |
| 8,482,271 B2 | * | 7/2013 | Prodic | ................. H02M 3/1588 323/283 |
| 2012/0133346 A1 | | 5/2012 | Ogawa et al. | |

FOREIGN PATENT DOCUMENTS

| | | |
|---|---|---|
| JP | 2007252185 A | 9/2007 |
| JP | 2011109806 A | 6/2011 |
| JP | 2012119767 A | 6/2012 |

OTHER PUBLICATIONS

Haitao Hu et al., "Nonuniform A/D Quantization for Improved Dynamic Responses of Digitally Controlled DC-DC Converters" IEEE Transactions on Power Electronics, vol. 23, No. 4, pp. 1998-2005, Jul. 2008.

* cited by examiner

*Primary Examiner* — Rajnikant Patel
(74) *Attorney, Agent, or Firm* — White & Case LLP

(57) ABSTRACT

A feedback loop, which feedbacks information of an output voltage or a load current, is provided. The feedback loop has a first mode, which digitalizes and feedbacks the information of the current voltage or the load current, and a second mode, which feedbacks the information as an analog value.

15 Claims, 12 Drawing Sheets

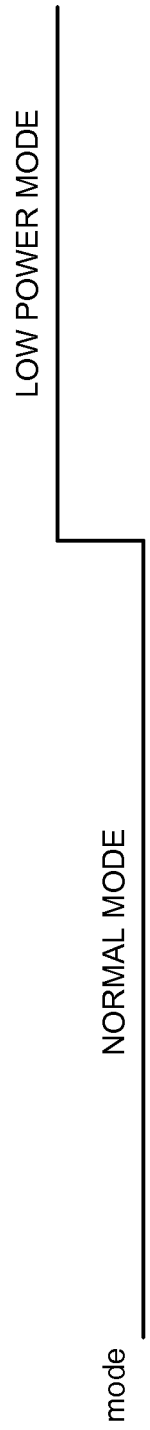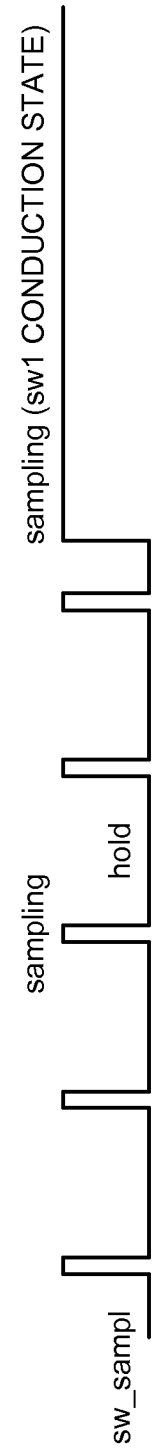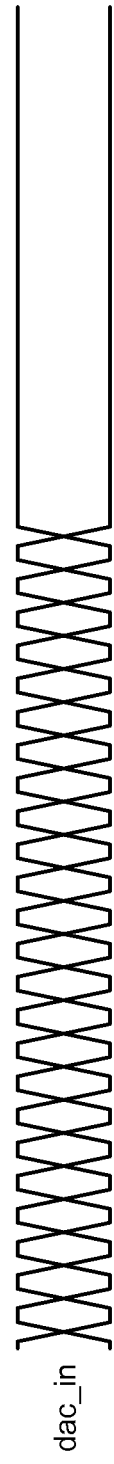

SEMICONDUCTOR INTEGRATED CIRCUIT

CROSS-REFERENCE TO RELATED APPLICATIONS

This application is based upon and claims the benefit of priority from Japanese Patent Application No. 2013-144839, filed on Jul. 10, 2013; the entire contents of which are incorporated herein by reference.

FIELD

Embodiments of the present invention relate to a semiconductor integrated circuit.

BACKGROUND

Conventionally, a digitally controlled semiconductor integrated circuit, which converts a direct current input voltage into a predetermined direct current output voltage and outputs the direct current output voltage, has been known. A case of the digital control, for example, has an advantage of being hardly affected by noises.

On the other hand, in the digitally controlled semiconductor integrated circuit, it is necessary to use an AD converter to digitalize and control an output voltage or an output current. Since power consumption of the AD converter is large, a technique for increasing conversion efficiency is required.

One embodiment of the present invention feedbacks information of an output voltage or a load current and has a feedback loop. A semiconductor integrated circuit, where the feedback has a first mode which digitalizes and feedbacks the information of the current voltage or the load current and a second mode which feedbacks the information as an analog value, is provided.

BRIEF DESCRIPTION OF THE DRAWINGS

FIGS. 2A to 2C are waveform charts for explaining an operation of the first embodiment;

DETAILED DESCRIPTION

Referring to the accompanying drawings, semiconductor integrated circuits according to embodiments will be described below in detail. It should be noted that the present invention is not limited by these embodiments.

Figure 1:
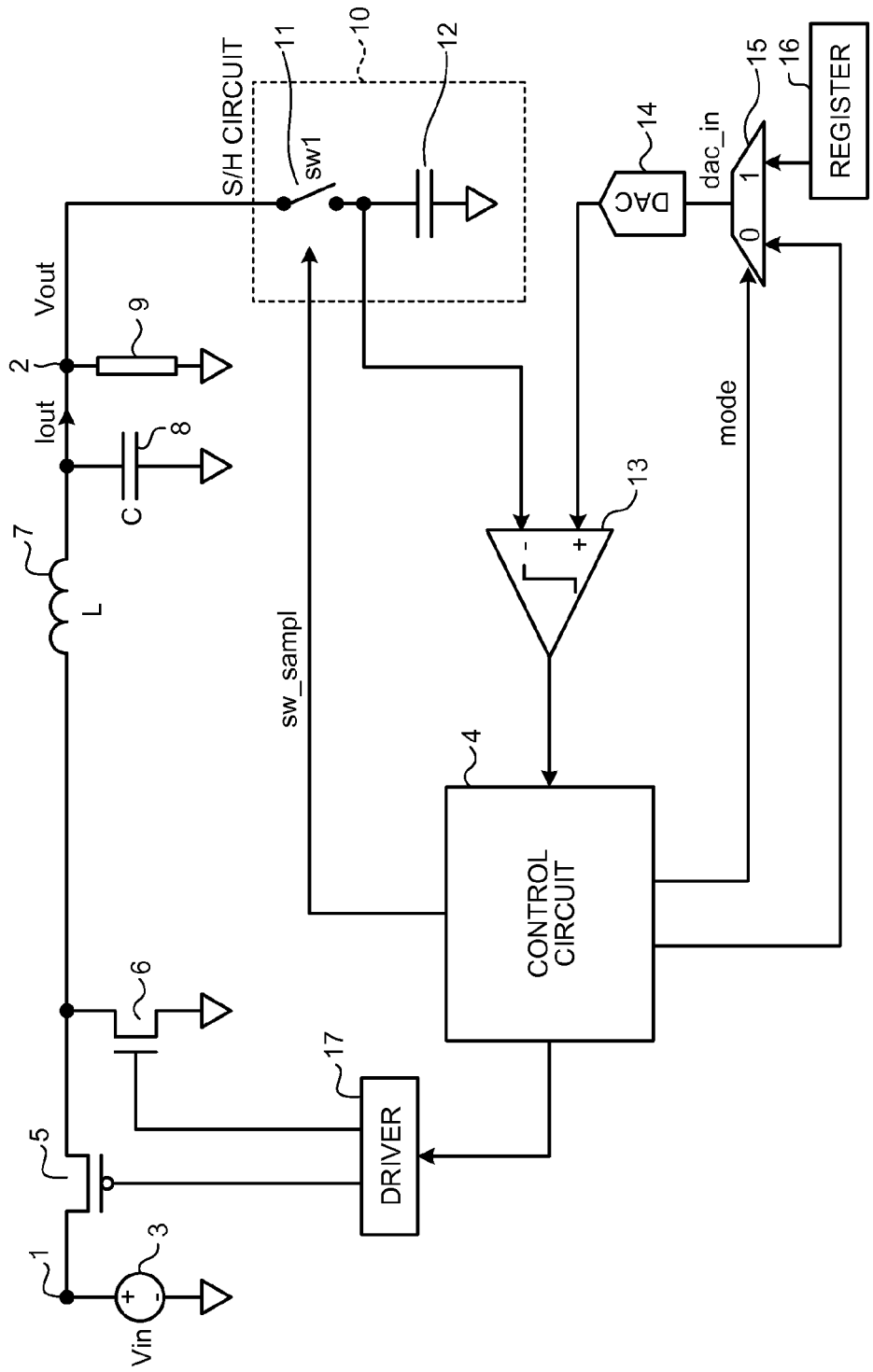
FIG. 1 is a diagram illustrating a semiconductor integrated circuit of a first embodiment.

FIG. 1 is a diagram illustrating a structure of a semiconductor integrated circuit of a first embodiment. The present embodiment has an input terminal 1, to which a direct current voltage source 3 is connected and to which a direct current input voltage Vin is applied. The present embodiment has a PMOS transistor 5, in which a source electrode is connected to the input terminal 1 and a drain electrode is connected to one end of an inductor 7. A drain electrode of an NMOS transistor 6 is connected to the drain electrode of the PMOS transistor 5. A source electrode of the NMOS transistor 6 is grounded. The PMOS transistor 5 and the NMOS transistor 6 constitute a switching element, which is turned on and off in response to a drive signal supplied from a driver 17.

Another end of the inductor 7 is connected to an output terminal 2. One end of a capacitor 8 is connected to the output terminal 2, and another end thereof is grounded. The output terminal 2 supplies an output voltage Vout to a load 9.

The output voltage Vout is supplied to a sample hold circuit 10 constituting a voltage feedback loop. The sample hold circuit 10 has a switch 11 and a capacitor 12. A connection between the switch 11 and the capacitor 12 is connected to an inverting input terminal (−) of a comparator 13. An output of a DA converter 14 is supplied to a non-inverting input terminal (+) of the comparator 13. An output of the comparator 13 is supplied to a control circuit 4. The on/off of the switch 11 of the sample hold circuit 10 is controlled by a sampling signal sw_sampl supplied from the control circuit 4.

An output of a selection circuit 15 is supplied to the DA converter 14. In response to a mode switching signal mode from the control circuit 4, the selection circuit 15 performs switching of the signal from the control circuit 4 and an output of a register 16.

An output of the control circuit 4 is supplied to the driver 17. In response to the output of the control circuit 4, the driver 17 supplies the drive signal to gate electrodes of the PMOS transistor 5 and the NMOS transistor 6. In case of increasing the output voltage Vout, the control circuit 4 performs control of increasing a ratio Duty, in which the PMOS transistor is turned on.

During a normal operation, that is, in a normal mode, the sample hold circuit 10 performs a sampling operation according to the sampling signal sw_sampl from the control circuit 4. The sample hold circuit, the comparator 13, a search logic (not illustrated) provided in the control circuit 4, and the DA converter 14 constitute a successive approximation register (SAR: Successive Approximation Register) AD converter (hereinafter referred to as "SAR-ADC"). In the normal mode, the control by the SAR-ADC is performed.

On the other hand, in a low power mode, the sampling signal sw_sampl from the control circuit 4 becomes a High level fixed value, and the switch 11 is fixed in an on-state. In other words, the SAR-ADC is stopped. As a result, the output voltage Vout is supplied as it is to the non-inverting input terminal of the comparator 13. A signal from the register 16 is supplied to the non-inverting input terminal (+) of the comparator 13 via the selection circuit 15. Data indicating a predetermined reference voltage Vref is stored in the register 16, and this data is converted into analog data and supplied to the comparator 13.

In the present embodiment, in the normal mode, the control by the SAR-ADC is performed. During a light load when a load current Iout is small, the normal mode is switched to the low power mode by the mode switching signal mode from the control circuit 4. In the low power mode, the operation of the SAR-ADC is stopped. Accordingly, the present embodiment is capable of reducing the power consumption.

FIGS. 2A to 2C are waveform charts for explaining an operation of the semiconductor integrated circuit of the first embodiment. FIG. 2A illustrates the mode switching signal mode output from the control circuit 4. The mode switching signal mode has a Low level in the normal mode and a High level in the low power mode. FIG. 2B illustrates the sampling signal sw_sampl. The sampling signal has a predetermined High level and Low level during the normal mode, and is fixed to the High level during the low power mode. The signal of this fixed level is supplied to the switch 11 of the sample hold circuit 10. In this way, the switch 11 is in a conduction state. FIG. 2C illustrates the signal supplied to the DA converter 14. During the normal mode, the data by the SAR-ADC operation is supplied from the control circuit 4. During the low power mode, a fixed value stored in the register 16 is supplied.

Figure 3:
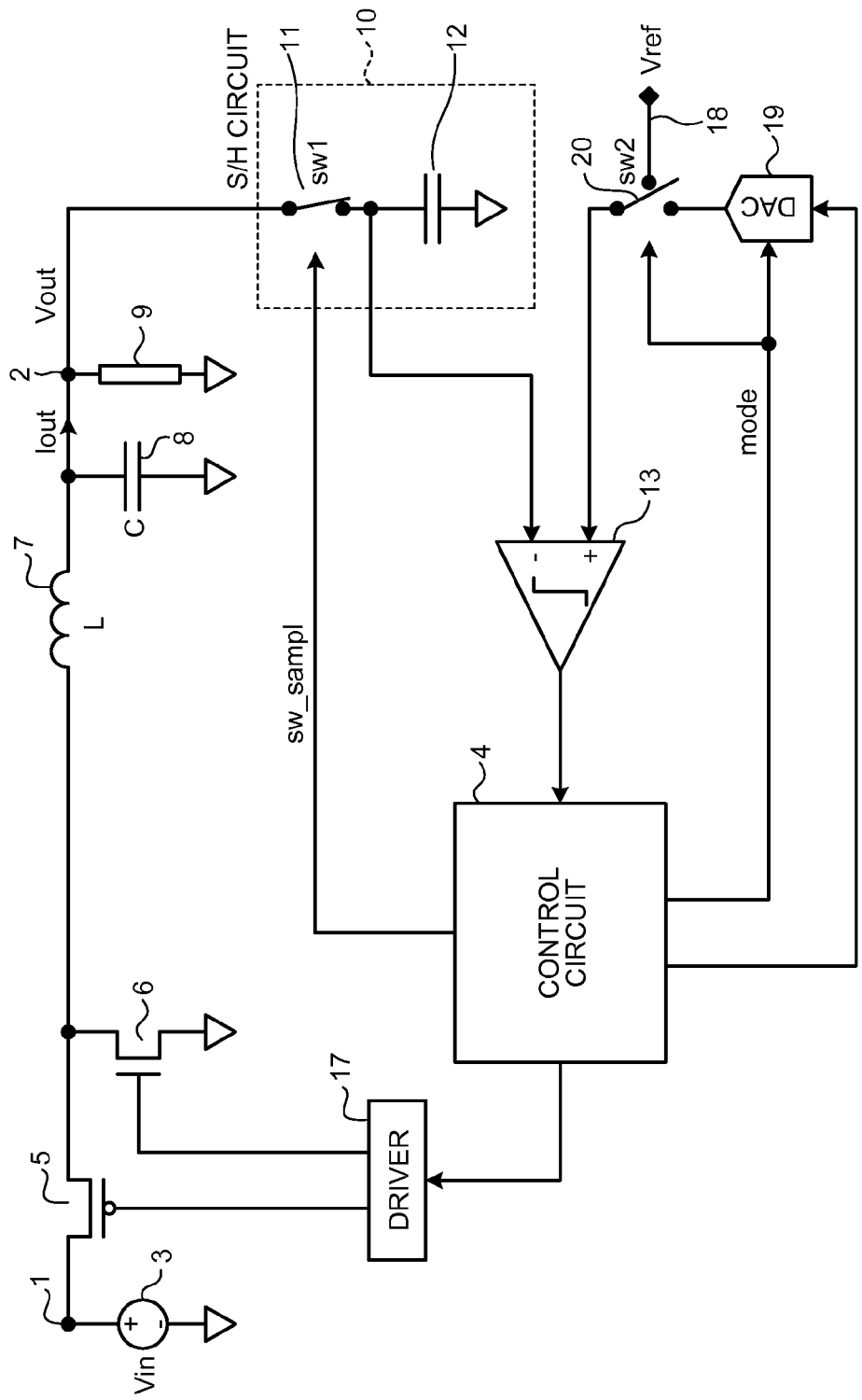
FIG. 3 is a diagram illustrating a semiconductor integrated circuit of a second embodiment.

FIG. 3 is a diagram illustrating a semiconductor integrated circuit of a second embodiment. Components corresponding to the first embodiment are described using the same reference numerals, and descriptions thereof are omitted. In the present embodiment, a signal from a switch 20 is supplied to a non-inverting input terminal (+) of a comparator 13. The switch 20 is controlled by a mode switching signal mode from a control circuit 4. By the mode switching signal mode, a signal from a DA converter 19 and a reference voltage Vref supplied to a terminal 18 are selected and supplied to the comparator 13. In a normal mode, an output signal by an SAR-ADC operation is supplied from the DA converter 19. In a low power mode, the reference voltage Vref (fixed value) applied to the terminal 18 is supplied.

In the present embodiment, the control using the fixed reference voltage Vref is performed in the low power mode. As a result, since it is not necessary to operate the DA converter 19 in the low power mode, the power consumption is reduced.

Figure 4:
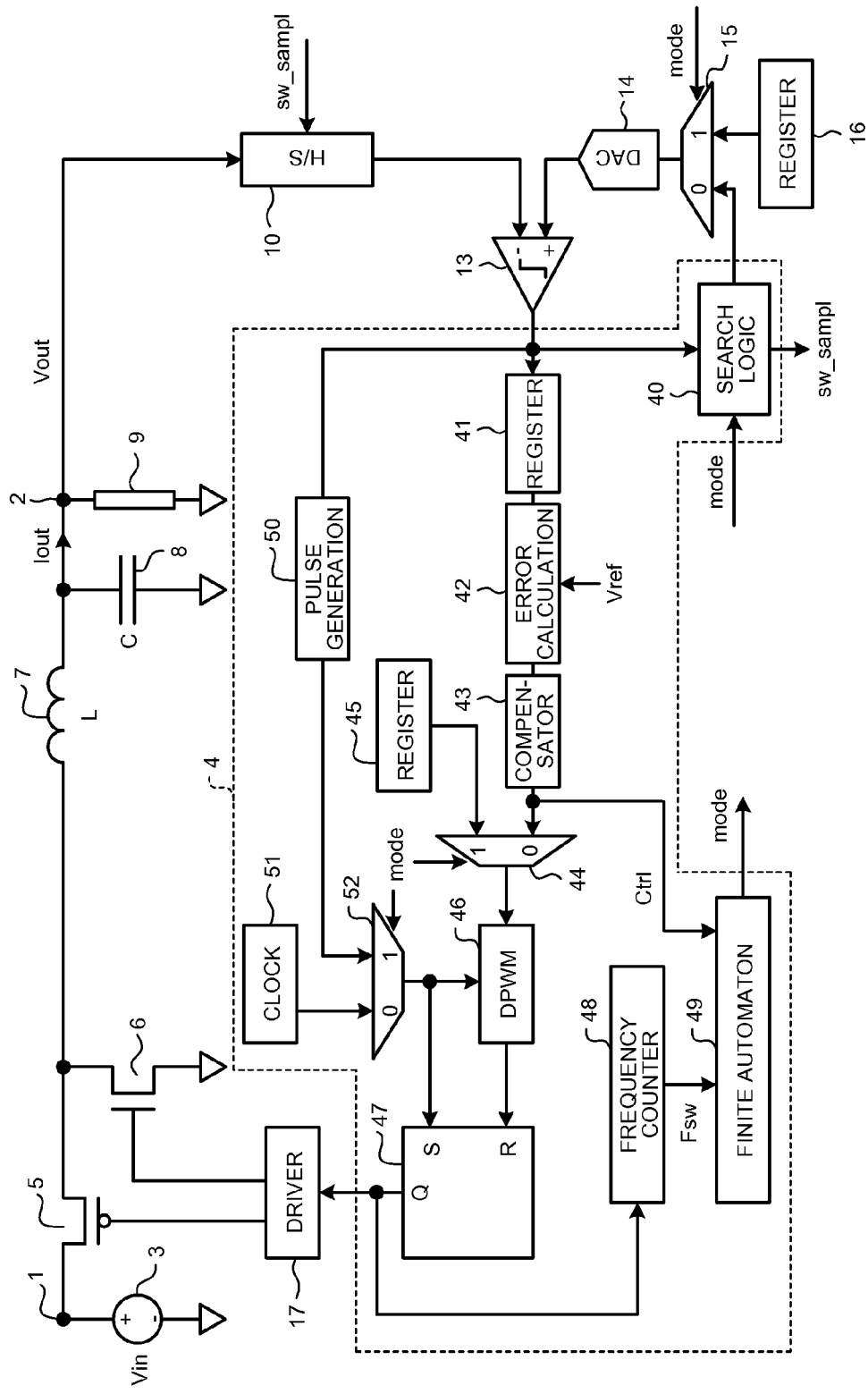
FIG. 4 is a diagram illustrating a semiconductor integrated circuit of a third embodiment.

FIG. 4 is a diagram illustrating a semiconductor integrated circuit of a third embodiment. Components corresponding to the above-described embodiments are described using the same reference numerals, and descriptions thereof are omitted. A control circuit 4 of the present embodiment has a search logic 40, to which an output of a comparator 13 is supplied. The comparator 13, the search logic 40, and a DA converter 14 constitute an SAR-ADC which executes a binary search algorithm. A comparison result by the comparator 13 is supplied to a register 41. Data in the register 41 indicates a value of a digitally converted output voltage Vout. An output of the register 41 is supplied to an error calculation circuit 42 and compared with a reference voltage Vref (digital value). An output of the error calculation circuit 42 is supplied to a compensator 43.

The compensator 43, for example, performs a PID (Proportional Integral Derivative) control and outputs a control signal Ctrl in such a manner that the output voltage Vout is equal to the reference voltage Vref. The output signal from the compensator 43 is supplied to a digital pulse width modulator 46 via a selection circuit 44. A signal, in which a pulse width is adjusted according to the output signal from the compensator 43, is supplied from the digital pulse width modulator 46 to a reset input terminal R of an RS latch circuit 47. On the other hand, a signal selected by a selection circuit 52 according to a mode switching signal mode is supplied to a set input terminal S of the RS latch circuit 47.

In a normal mode, an output of a clock generation circuit 51 is supplied to the RS latch circuit 47. In other words, in the normal mode, the RS latch circuit 47 is set by a clock signal from the clock generation circuit 51 and reset by an output of the digital pulse width modulator 46. An output signal of the RS latch circuit 47 is supplied to a driver 17.

In a low power mode, an output of a pulse generation circuit 50 is selected by the selection circuit 52. In the low power mode, by a mode switching signal mode from a finite automaton 49, a search operation of the search logic 40 is stopped, and a sampling signal sw_sampl fixed to a High level is supplied to a sample hold circuit 10. Accordingly, the output voltage Vout is supplied as it is to an inverting input terminal (−) of the comparator 13. Data of a register 16 indicating a predetermined reference voltage Vref is converted into an analog value and supplied to a non-inverting input terminal (+) of the comparator 13. When the output voltage Vout is lower than an output of the DA converter 14, the comparator 13 outputs a High level signal.

In the case where the output of the comparator 13 is a High level, the pulse generation circuit 50 generates a pulse having a fixed width in a predetermined timing. The output of the pulse generation circuit 50 is supplied to the set input terminal S of the RS latch circuit 47 via the selection circuit 52. Data indicating the fixed width data is stored in a register 45 and supplied to the digital pulse width modulator 46 via the selection circuit 44. The output of the pulse generation circuit 50 is also supplied to the digital pulse width modulator 46 via the selection circuit 52. With this configuration, the pulse width is adjusted by the digital pulse width modulator 46, and a signal having a High level and a fixed width is output from the RS latch circuit 47. In other words, in the low power mode, the output voltage Vout and the predetermined reference voltage Vref are compared, and a pulse frequency modulation (PFM: Pulse Frequency Modulation) control, in which a frequency of a drive signal supplied to a PMOS transistor 5 is controlled by the comparison results, is performed.

An output of the RS latch circuit 47 is supplied to a frequency counter 48. The frequency counter 48 counts the output of the RS latch circuit 47 during a predetermined period and supplies the information to the infinite automaton 49. In a case where the count value of the frequency counter 48 during the predetermined period is higher than a predetermined threshold value, the finite automaton 49 performs a control of switching a control mode to the normal mode. This is because since a ratio Duty, in which the PMOS transistor 5 is turned on, increases with the increase of a pulse number supplied to the driver 17, a load current Iout increases.

In the present embodiment, the control signal Ctrl from the compensator 43 is compared with the predetermined threshold value, and switching from the normal mode to the low power mode is performed. In other words, in a case where the control signal Ctrl which adjusts a duration of a High level of the PWM signal is smaller than the predetermined threshold value, and the period of the High level of the PWM signal, i.e., a period in which the PMOS transistor 5 is turned on, is smaller than the predetermined threshold value, it is judged that a loading state is low, and the mode is shifted to the low power mode. In the low power mode, a sampling operation of the sample hold circuit 10 configuring a feedback loop of the output voltage is stopped, and the SAR-ADC operation is stopped. With this configuration, power consumption during the low load is reduced.

Figure 5:
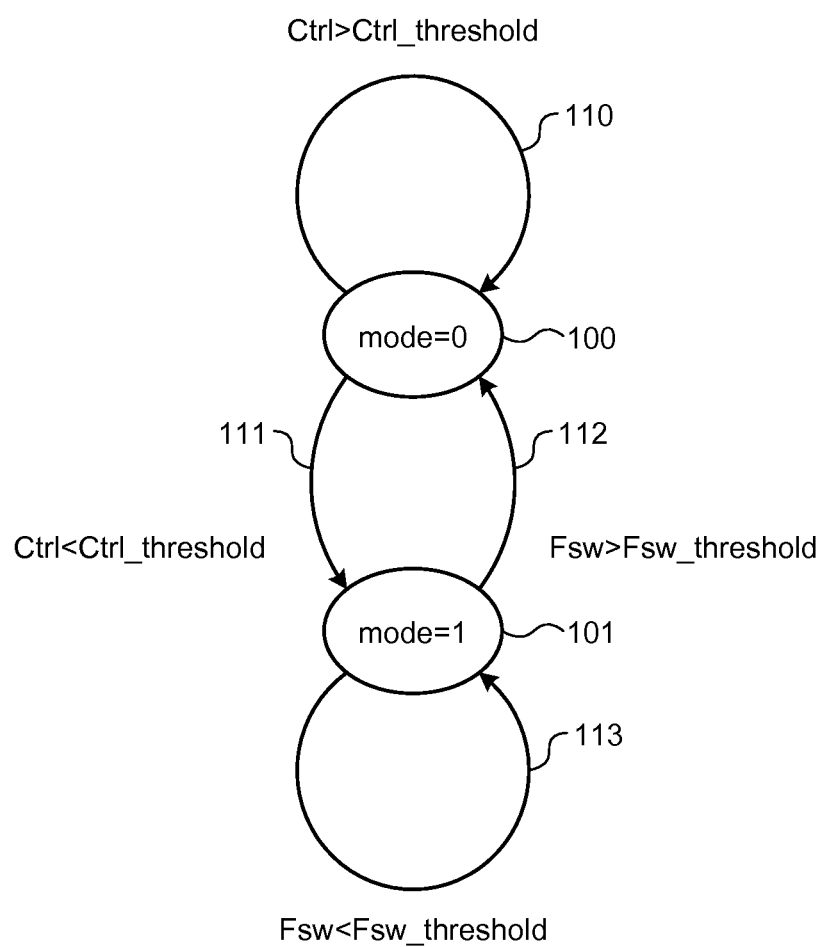
FIG. 5 is a diagram illustrating an embodiment of a finite automaton used in the semiconductor integrated circuit of the third embodiment.

FIG. 5 is a diagram illustrating an embodiment of the finite automaton 49 used in the semiconductor integrated circuit of the third embodiment. The finite automaton 49 is illustrated in a state transition diagram. The finite automaton 49 has a structure of switching two modes. A first state (mode=0) 100 is a state of the normal mode. In the first state (mode=0) 100, the sampling signal sw_sampl is supplied to the sample hold circuit 10, and a digital conversion operation is performed. In a second state (mode=1) 101, the sampling operation of the sample hold circuit 10 provided at the feedback loop of the output voltage Vout is stopped, and the digital conversion operation is stopped.

In a case where the control signal Ctrl adjusting the PWM signal is larger than a predetermined threshold value Ctrl_threshold, the first state (mode=0) 100 is maintained (110). Transition from the first state (mode=0) 100 to the second state (mode=1) 101 is performed in a case where the control signal Ctrl adjusting the duration of the High level of the PWM signal is small than the predetermined threshold value Ctrl_threshold (111). Transition from the second state (mode=1) 101 to the first state (mode=0) 100 is performed in a case where a frequency Fsw during a predetermined period of the signal supplied to the driver 17 exceeds a predetermined threshold value Fsw_threshold (112). In a case where the frequency Fsw of the signal supplied to the driver 17 is smaller than the predetermined threshold value Fsw_threshold, the second state (mode=1) 101 is maintained (113). For example, a concrete structure of the finite automaton 49 has a comparator (not illustrated) comparing the control signal Ctrl with the predetermined threshold value Ctrl_threshold, a comparator (not illustrated) comparing the frequency Fsw with the predetermined threshold value Fsw_threshold, a register (not illustrated) storing each data, and the like.

Figure 6:
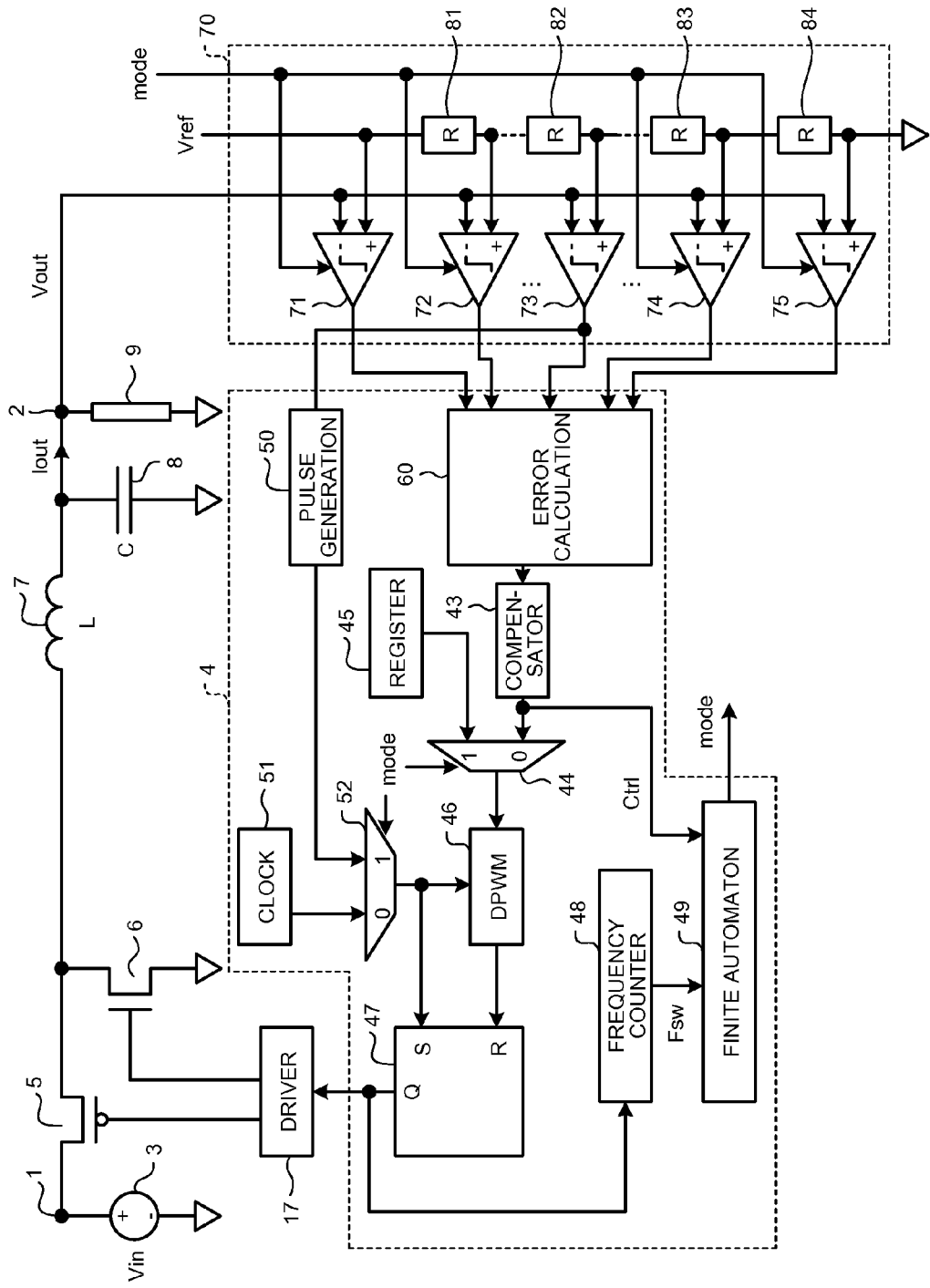
FIG. 6 is a diagram illustrating a semiconductor integrated circuit of a fourth embodiment.

FIG. 6 is a diagram illustrating a semiconductor integrated circuit of a fourth embodiment. Components corresponding to the above-described embodiments are described using the same reference numerals, and descriptions thereof are omitted. In the present embodiment, a feedback loop of an output voltage Vout has a parallel type (windowed flash) AD converter 70 (hereinafter referred to as "parallel type ADC"). The parallel type ADC 70 has a plurality of comparators (71 to 75) connected in parallel. The output voltage Vout is supplied to an inverting input terminal (−) of each comparator (71 to 75). A voltage resistively divided by a plurality of resistors (81 to 84), in which a reference voltage Vref is connected in series, (hereinafter referred to as "reference signal") is supplied to a non-inverting input terminal (+) of each comparator (71 to 75).

In a normal mode, each comparator (71 to 75) compares a size of the output voltage Vout, which has been input, and the reference signal, and outputs a High level or Low level signal according to the comparison result. The output of each comparator (71 to 75) is supplied to an error calculation circuit 60. In the error calculation circuit 60, the output of each comparator (71 to 75) is encoded and converted into a digital value, which is then supplied to a compensator 43. The compensator 43, for example, performs a PID control and outputs a control signal Ctrl so that the output voltage Vout is equal to the reference voltage Vref.

In a low power mode, for example, a control, in which only the comparator 73 is operated and operations of the other comparators are stopped, is performed by a mode switching signal mode from a finite automaton 49. A comparison between the output voltage Vout and the reference signal supplied to the comparator 73 is performed by the comparator 73. In a case where the output voltage Vout is lower than the reference signal supplied to the comparator 73, a High level signal is output from the comparator 73 and supplied to a pulse generation circuit 50. The pulse generation circuit 50 outputs a pulse having a fixed width in a predetermined timing in response to the High level signal from the comparator 73. The output of the pulse generation circuit 50 is supplied to a set input terminal S of an RS latch circuit 47 via a selection circuit 52.

In the present embodiment, mode switching is performed by comparing the control signal Ctrl from the compensator 43 and a predetermined threshold value Ctrl_threshold, and a count value Fsw of a frequency counter 48 and a predetermined threshold value Fsw_threshold. In the low power mode, comparators other than the specific comparator 73, which constitute the parallel type ADC, are stopped. Therefore, power consumption can be reduced.

Figure 7:
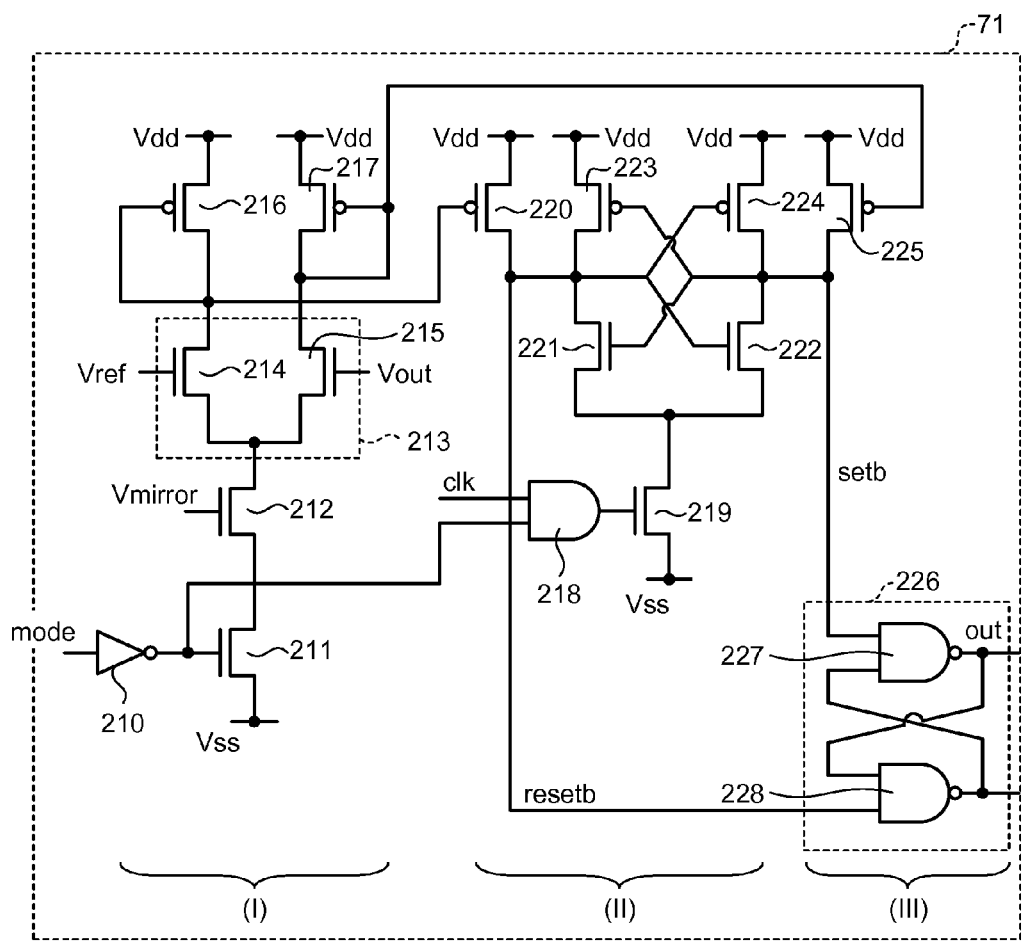
FIG. 7 is a diagram illustrating an embodiment of a comparator used in the semiconductor integrated circuit of the fourth embodiment.

FIG. 7 is a diagram illustrating an embodiment of a comparator used in the fourth embodiment. For example, FIG. 7 illustrates a structure of a comparator 71. The comparator 71 has a preamplifier (I), a sense amplifier (II), and a latch (III). The preamplifier (I) has an NMOS transistor 214 and an NMOS transistor 215, which constitute a differential pair 213. Series connection of an NMOS transistor 212 and an NMOS transistor 211, which constitute a current source, is connected to source electrodes of the NMOS transistor 214 and the NMOS transistor 215, which constitute the differential pair 213.

A mode switching signal mode is supplied to a gate electrode of the NMOS transistor 211 via an inverter 210. A bias voltage Vmirror of a separately-provided current mirror circuit (not illustrated) is applied to a gate electrode of the NMOS transistor 212. As loads, a PMOS transistor 216 and a PMOS transistor 217 are connected to drain electrodes of the NMOS transistor 214 and the NMOS transistor 215, which constitute the differential pair 213.

The sense amplifier (II) has a PMOS transistor 220 and a PMOS transistor 225, and gate electrodes thereof receive outputs of the preamplifier (I). A PMOS transistor 223 is connected in parallel to the PMOS transistor 220. A PMOS transistor 224 is connected in parallel to the PMOS transistor 225. Further, the sense amplifier (II) has an NMOS transistor 221 and an NMOS transistor 222, and source electrodes thereof are connected in common. A drain electrode of the NMOS transistor 221 is connected to a drain electrode of the PMOS transistor 223. A drain electrode of the NMOS transistor 222 is connected to a drain electrode of the PMOS transistor 224.

Gate electrodes of the NMOS transistor 221 and the PMOS transistor 223 are connected in common and connected to a drain electrode of the PMOS transistor 225. Gate electrodes of the NMOS transistor 222 and the PMOS transistor 224 are connected in common and connected to a drain electrode of the PMOS transistor 220. A drain electrode of an NMOS transistor 219 is connected to source electrodes of the NMOS transistor 221 and the NMOS transistor 222. A source electrode of the NMOS transistor 219 is grounded. An output of an AND circuit 218 is supplied to a gate electrode of the NMOS transistor 219. The mode switching signal mode inverted by the inverter 210 and a clock signal clk are supplied to the AND circuit 218.

The latch (III) has a NAND circuit 227 and a NAND circuit 228. A signal from the drain electrode of the PMOS transistor 225 and an output of the NAND circuit 228 are supplied to the NAND circuit 227. A signal from the drain electrode of the PMOS transistor 220 and an output of the NAND circuit 227 are supplied to the NAND circuit 228. The latch (III) configures an RS latch circuit.

In the comparator 71, the output voltage Vout and the reference voltage Vref are compared by the NMOS transistor 214 and the NMOS transistor 215, which constitute the differential pair 213 of the preamplifier (I). The comparison result is amplified by the sense amplifier (II). Amplified signals (setb, resetb) are supplied to a latch circuit 226.

The operation of the comparator 71 can be controlled by the mode switching signal mode. In other words, only when an inverted signal of the mode switching signal mode supplied to the NMOS transistor 211 via the inverter 210 is a High level, the NMOS transistor 211 is turned on, and the comparison operation by the comparator 71 is performed. Accordingly, power consumption can be restrained. Likewise, only when the two signals supplied to the AND circuit 218 of the sense amplifier (II), i.e., the mode switching signal mode inverted by the inverter 210 and the clock signal clk, are High, the sense amplifier (II) operates. Therefore, power consumption is restrained. The comparator 71, in which the operation is controlled by the mode switching signal mode and the power consumption is restrained, is provided.

Figure 8:
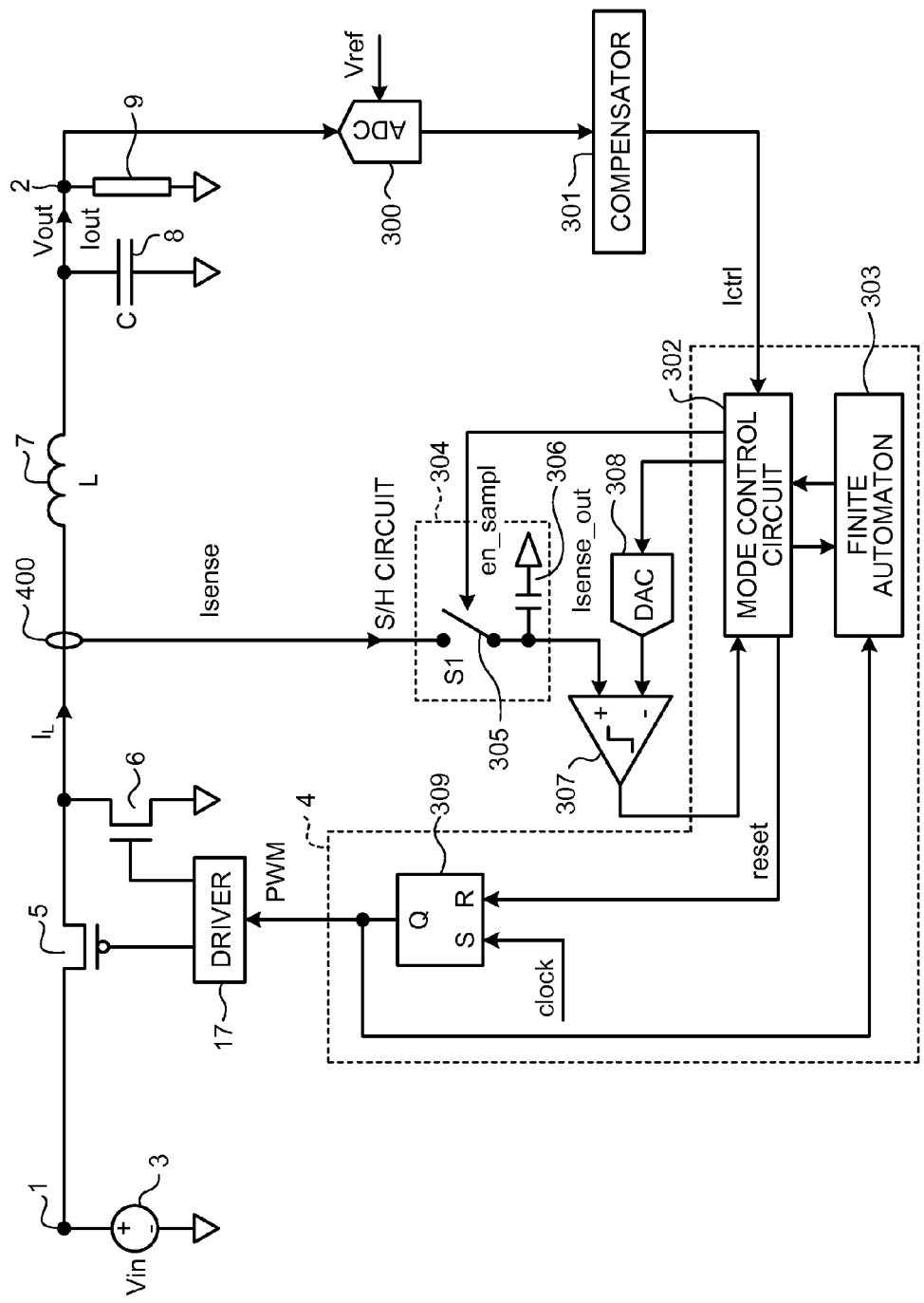
FIG. 8 is a diagram illustrating a semiconductor integrated circuit of a fifth embodiment.

FIG. 8 is a diagram illustrating a semiconductor integrated circuit of a fifth embodiment. Components corresponding to the above-described embodiments are described using the same reference numerals, and descriptions thereof are omitted. The present embodiment has a current feedback loop which feedbacks inductor current $I_L$ as information of a load current Iout. In other words, there is a current sensor 400 which senses the inductor current $I_L$. A feedback current signal Isense, which is an output of the current sensor 400, is supplied to a sample hold circuit 304. The sample hold circuit 304 has a switch 305, which is on/off controlled by a sampling signal en_sampl, and a capacitor 306. An output Isense_out of the sample hold circuit 304 is supplied to a non-inverting input terminal (+) of a comparator 307. An output of a DA converter 308 is supplied to an inverting input terminal (−) of the comparator 307. The sample hold circuit 304, the comparator 307, the DA converter 308, and a search logic (not illustrated) provided in a mode control circuit 302 constitute an SAR-ADC.

The present embodiment includes a feedback loop of an output voltage Vout. The output voltage Vout digitalized in an AD converter 300 is compared with a reference voltage Vref, and the differential signal is supplied to a compensator 301. The compensator 301, for example, performs PID control and outputs a control signal Ictrl in such a manner that the output voltage Vout is equal to the reference voltage Vref. The control signal Ictrl is supplied to the mode control circuit 302.

The mode control circuit 302 performs switching of the current feedback loop under control of a finite automaton 303. In a range in which the feedback current signal Isense of the inductor current $I_L$ is smaller than a predetermined threshold value, a sampling signal en_sampl having a High level and a Low level at a predetermined cycle is supplied to the sample hold circuit 304. In other words, control in a digital conversion mode is performed.

When the feedback current signal Isense of the inductor current $I_L$ exceeds the predetermined threshold value, the mode control circuit 302 supplies the sampling signal en_sampl fixed to the High level to the switch 305 of the sample hold circuit 304. In this way, the feedback current signal Isense is supplied as it is to the comparator 307. A mode in which the feedback current signal Isense is supplied as it is to the comparator 307 is hereinafter referred to as "straight comparison mode".

The feedback current signal Isense and the control signal Ictrl supplied via the DA converter 308 are compared by the comparator 307. When the feedback current signal Isense is larger than the control signal Ictrl, a High level signal is output from the comparator 307. Upon receiving the High level signal from the comparator 307, a reset signal reset is supplied from the mode control circuit 302 to a latch input terminal R of an RS latch circuit 309. Due to the reset signal reset, a PWM signal, which is an output of the RS latch circuit 309, falls down. The PWM signal from the RS latch circuit 309 is supplied to a driver 17. An output signal from the driver 17 is supplied to gate electrodes of a PMOS transistor 5 and an NMOS transistor 6.

The output of the RS latch circuit 309 is also supplied to the finite automaton 303. The finite automaton 303 detects the fall of the output of the RS latch circuit 309 and performs the mode switching control. In other words, the finite automaton 303 detects the fall of the output of the RS latch circuit 309 and performs switching to the digital conversion mode.

In the present embodiment, the comparison between the feedback current signal Isense and the predetermined threshold value is performed, and the mode switching of control is performed. In other words, when the feedback current signal Isense is smaller than the predetermined threshold value, the control in the digital conversion mode is performed. When the feedback current signal Isense exceeds the predetermined threshold value, the straight comparison mode, in which the feedback current signal Isense is used as an analog value, is performed. It is necessary to increase the sampling frequency to enhance accuracy of comparison between the feedback current signal Isense and the control signal Ictrl. Particularly, in order to lower the PWM signal when the feedback current signal Isense exceeds the control signal Ictrl, the control when the feedback current signal Isense approaches the value of the control signal Ictrl is important. In the present embodiment, when the feedback current signal Isense is higher than the predetermined threshold value, the mode is shifted to the straight comparison mode, in which the feedback current signal Isense is used as an analog value. Accordingly, since there is no need to have a structure using a high frequency sampling signal, the power consumption can be reduced.

Figure 9:
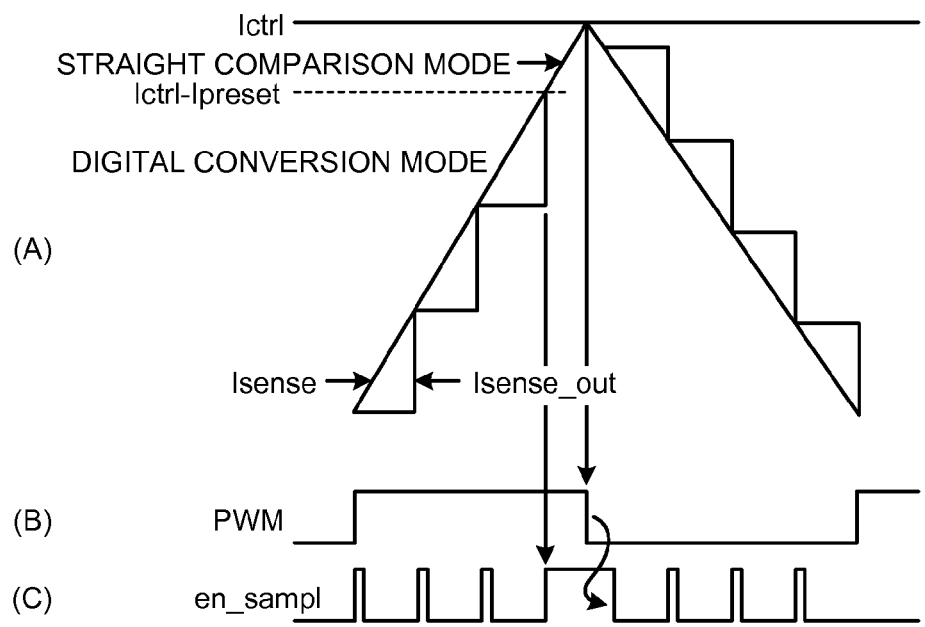
FIG. 9 is a waveform chart for explaining an operation of the semiconductor integrated circuit of the fifth embodiment.

FIG. 9 is a waveform chart for explaining an operation of the semiconductor integrated circuit of the fifth embodiment. As illustrated in (A) of FIG. 9, the control in the digital conversion mode is performed in a range in which the feedback current signal Isense is lower than the predetermined threshold value. More specifically, the control in the digital conversion mode is performed in the range in which the digital value Isense_out of the feedback current signal Isense goes up to the threshold value (Ictrl−Ipreset), which is lower than the control signal Ictrl by a set value Ipreset. When the digital value Isense_out of the feedback current signal Isense exceeds the threshold value (Ictrl−Ipreset), the mode is shifted to the straight comparison mode. In other words, as illustrated in (C) of FIG. 9, the sampling signal en_sampl to the sample hold circuit 304 is fixed to the High level. The control signal Ictrl and the feedback current signal Isense are compared. When the feedback current signal Isense exceeds the control signal Ictrl, the reset signal reset is supplied from the mode control circuit 302 to the RS latch circuit 309, and the PWM signal falls to the Low level ((B) of FIG. 9). Upon detecting the fall of the PWM signal, the mode is shifted to the digital conversion mode. In other words, the sampling signal en_sampl again becomes a pulse signal repeating the High level and the Low level, and is supplied to the sample hold circuit 304.

Figure 10:
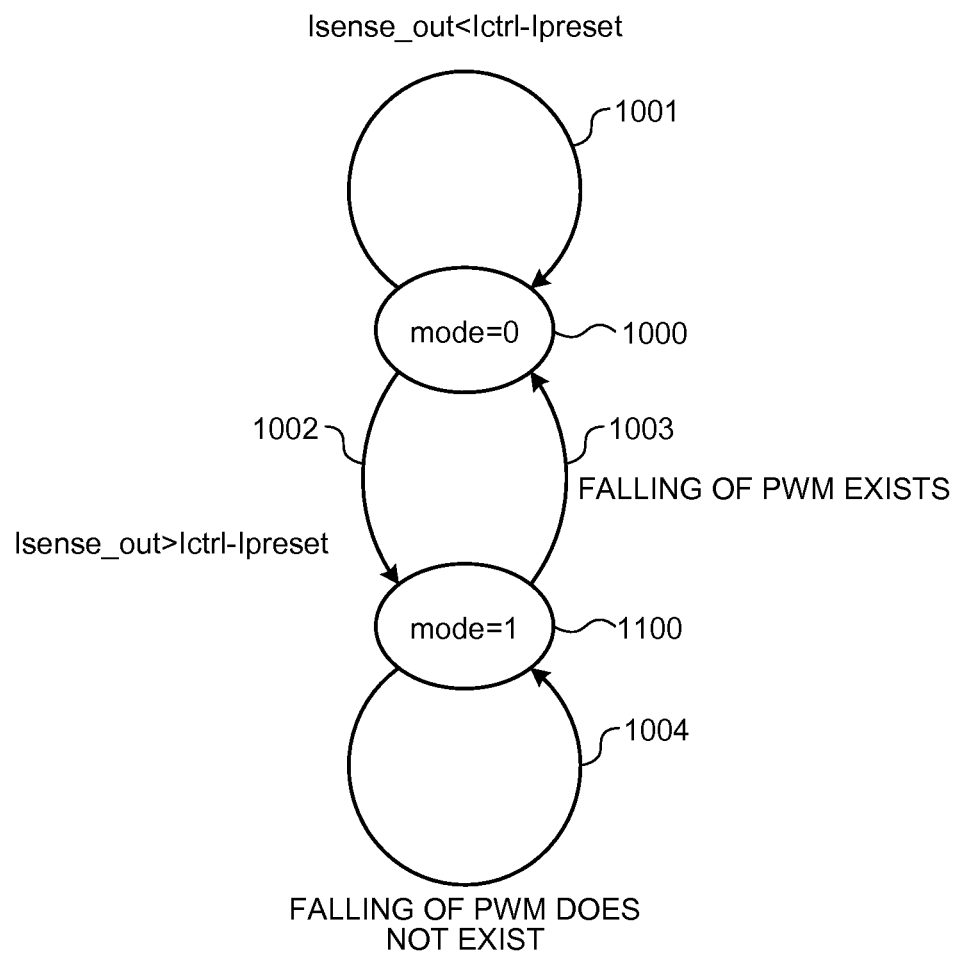
FIG. 10 is a diagram illustrating an embodiment of a finite automaton used in the semiconductor integrated circuit of the fifth embodiment.

FIG. 10 is a diagram illustrating an embodiment of the finite automaton 303 used in the semiconductor integrated circuit of the fifth embodiment. The finite automaton 303 is illustrated in a state transition diagram. The finite automaton 303 has a structure of switching two modes. A first state (mode=0) 1000 illustrates a digital conversion mode. In the first state (mode=0) 1000, the normal sampling signal is supplied to the sample hold circuit 304 provided at the feedback loop of the inductor current $I_L$, and the digital conversion operation is performed. While the digital value Isense_out of the feedback current signal Isense is smaller than the threshold value (Ictrl−Ipreset), the first state (mode=0) 1000 is maintained (1001).

In a second state (mode=1) 1100, the sampling signal sw_sampl having the fixed value is supplied to the sample hold circuit 304, and the digital conversion operation is stopped. Transition from the first state (mode=0) 1000 to the second state (mode=1) 1100 is performed when the digital value Isense out of the feedback current signal Isense exceeds the threshold value (Ictrl−Ipreset) (1002). Until the PWM signal falls, the second state (mode=1) 1100 is maintained (1004). Transition from the second state (mode=1) 1100 to the first state (mode=0) 1000 is performed when the falling of the PWM signal is detected (1003).

Figure 11:
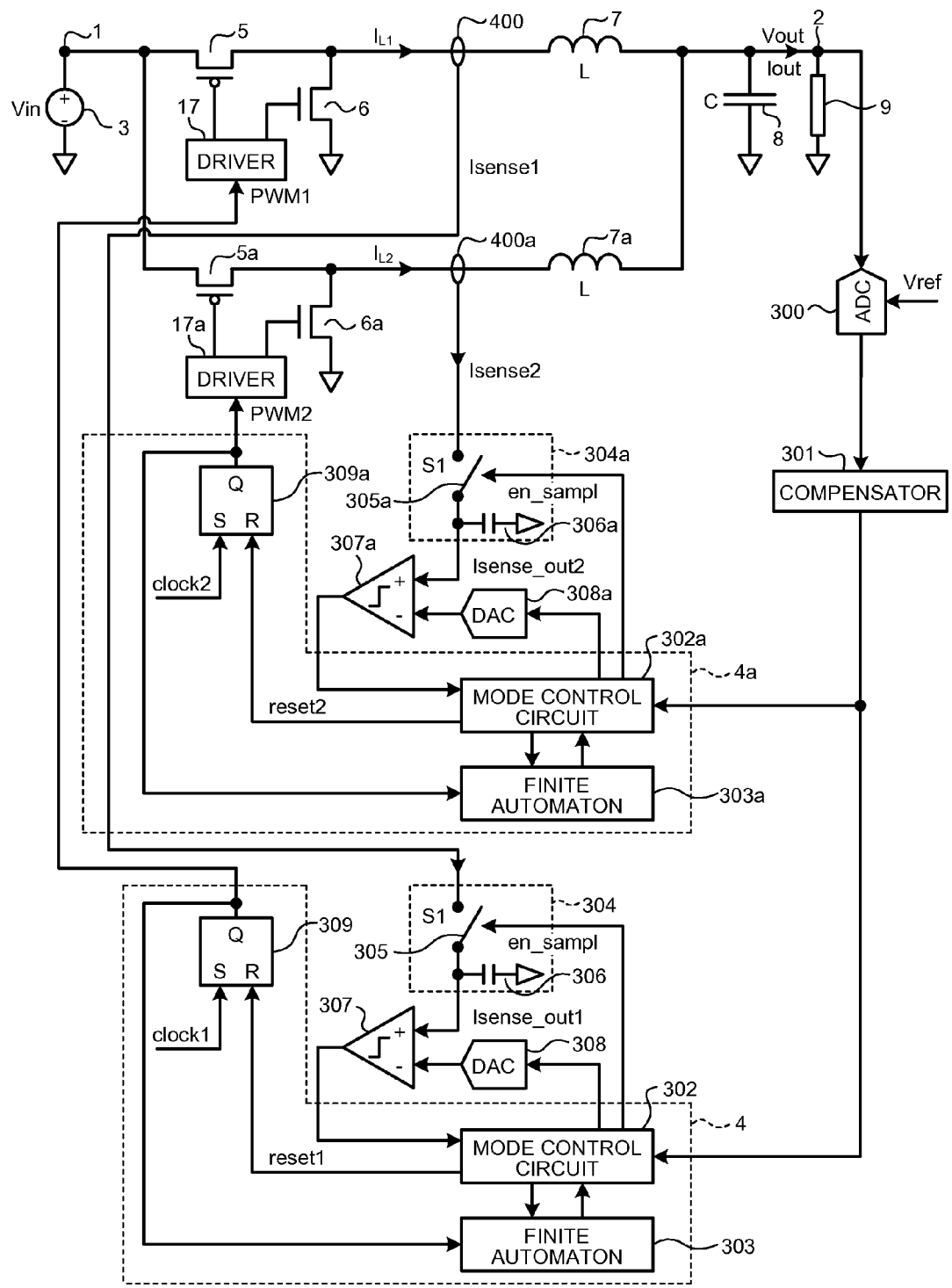
FIG. 11 is a diagram illustrating a semiconductor integrated circuit of a sixth embodiment.

FIG. 11 is a diagram illustrating a semiconductor integrated circuit of a sixth embodiment. Components corresponding to the above-described embodiments are described using the same reference numerals, and descriptions thereof are omitted. The present embodiment illustrates an embodiment of a two-phase multiphase semiconductor integrated circuit. In the present embodiment, one more stage of a similar structure is provided in addition to the semiconductor integrated circuit of the fifth embodiment described in FIG. 8. In other words, the present embodiment includes a control circuit 4a having a mode control circuit 302a and a finite automaton 303a, a sample hold circuit 304a having a switch 305a and a capacitor 306a to which a signal from a current sensor 400a is supplied, a comparator 307a which compares an output of the sample hold circuit 304a and an output of a DA converter 308a, a driver 17a, a PMOS transistor 5a and an NMOS transistor 6a which are on/off controlled by a drive signal from the driver 17a, and an inductor 7a. An AD converter 300 and a compensator 301 constituting a feedback loop of an output voltage Vout are shared.

According to the operation described in FIG. 8, control which uses a feedback current signal Isense1 of an inductor current $I_{L1}$ flowing through an inductor 7 is performed on a control circuit 4 side. On the other hand, control which uses a feedback current signal Isense2 of an inductor current $I_{L2}$ flowing through the inductor 7a is performed on the control circuit 4a side. Clock signals of different phases (clock1, clock2) are supplied to an RS latch circuit 309 of the control circuit 4 and an RS latch circuit 309a of the control circuit 4a. This is to offset ripples of a load current Iout and obtain the smoothed load current Iout.

In the present embodiment as well, sense of an inductor current $I_L$ is implemented in a digital conversion mode and a straight comparison mode. Accordingly, comparison operation between a feedback current signal Isense of the inductor current $I_L$ and a control signal Ictrl can be performed by the power reduced control. In the present embodiment, the structure applied to the two-phase semiconductor integrated circuit is illustrated. Further, the effect of power reduction is enhanced by applying to the structure with the increased number of phases.

Figure 12:
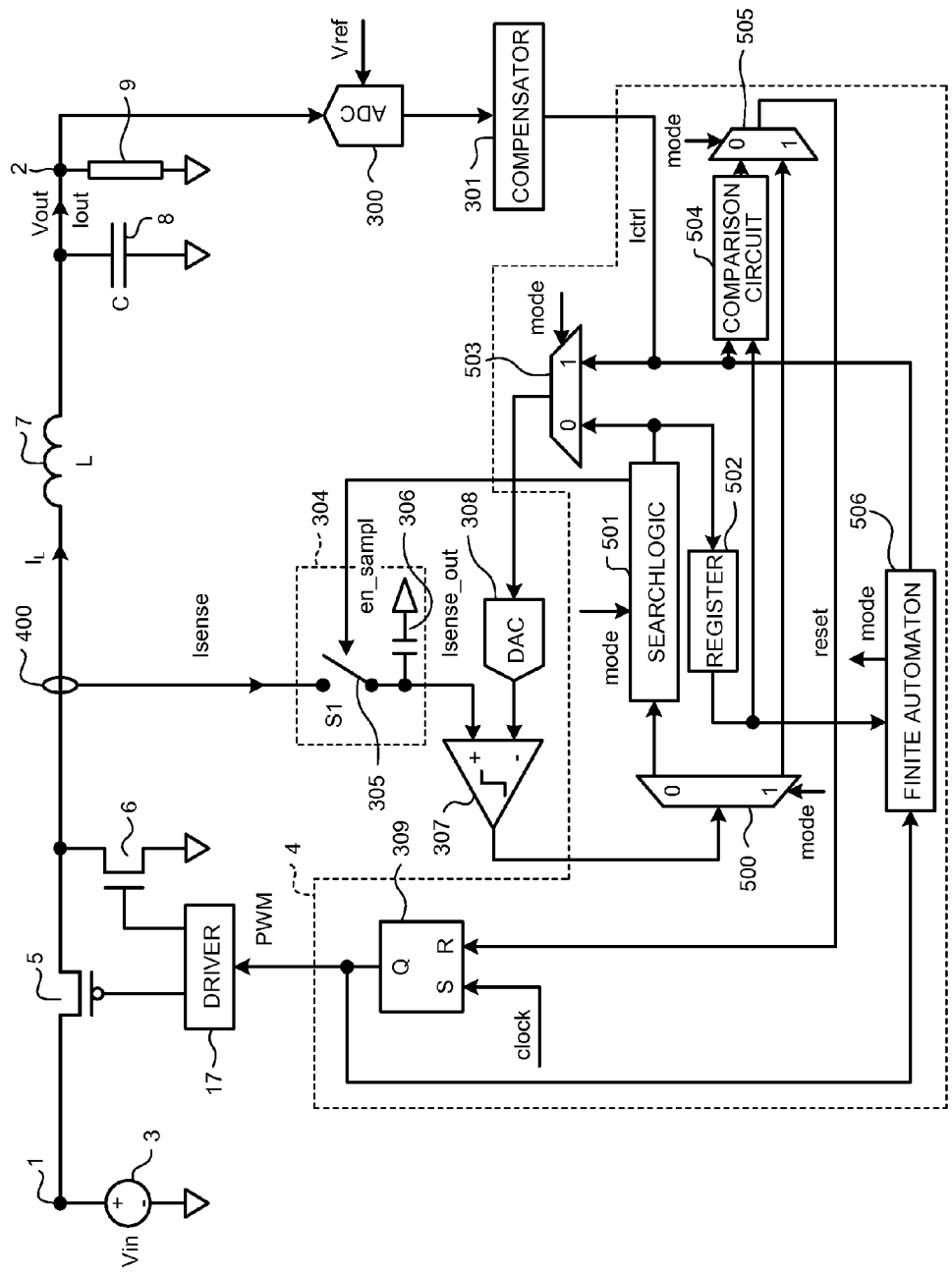
FIG. 12 is a diagram illustrating a semiconductor integrated circuit of a seventh embodiment.

FIG. 12 is a diagram illustrating a semiconductor integrated circuit of a seventh embodiment. Components corresponding to the above-described embodiments are described using the same reference numerals, and descriptions thereof are omitted. A control circuit 4 of the present embodiment has a search logic 501 which constitutes an SAR-ADC together with a sample hold circuit 304 and a DA converter 308. An output of the search logic 501 and a control signal Ictrl of a compensator 301 are selected by a selection circuit 503 and supplied to the DA converter 308 according to a mode switching signal mode. An output of the search logic 501 is supplied to a register 502. An output of the register 502 is supplied to a finite automaton 506 and a digital comparison circuit 504. In the digital comparison circuit 504, comparison between the control signal Ictrl from the compensator 301 and the output of the register 502 is performed.

The finite automaton 506 performs mode control according to the output of the register 502. In other words, in a case where a signal supplied from the register 502 is smaller than a threshold value (Ictrl−Ipreset), which is lower than the control signal Ictrl by a predetermined set value Ipreset, control in a digital conversion mode is performed. In a case where the signal supplied from the register 502 exceeds the threshold value (Ictrl−Ipreset), the control is shifted to control in a straight comparison mode. In response to the mode switching signal mode from the finite automaton 506, the output of each selection circuit (500, 503, 505) is switched.

The present embodiment has a digital comparison circuit 504, which compares the Ictrl from the compensator 301 and the output of the register 502. Accordingly, even if shifting from the digital conversion mode to the straight comparison mode cannot be performed due to sudden changes of a load, the comparison between the control signal Ictrl and the output of the register 502, i.e., a digital value Isense_out of a feedback current signal Isense, is performed. In a case where the digital value Isense_out of the feedback current signal Isense is larger than the control signal Ictrl, a reset signal reset is supplied from a selection circuit 505 to a latch input terminal R of an RS latch circuit 309. In this way, a PWM signal supplied to a driver 17 falls to a Low level. Consequently, reliable control by the control circuit 4 is possible even to the sudden changes of the load.

In the present embodiment as well, when the digital value Isense_out of the feedback current signal Isense is higher than the predetermined threshold value, the mode is shifted to the straight comparison mode using the feedback current signal Isense as the analog value. Therefore, since there is no need to have a structure using a high frequency sampling signal, the power consumption can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit which outputs an output voltage and supplies a load current to a load, comprising:
    an input terminal to which a power supply voltage is applied;
    an output terminal which outputs the output voltage;
    a switching element in which one end is connected to the input terminal and another end is connected to the output terminal;
    a control circuit which controls a ratio turning on the switching element; and
    a feedback loop which feedbacks information of the output voltage or information of the load current to the control circuit, wherein the feedback loop includes an AD converter, wherein
    the feedback loop digitalizes and feedbacks the information of at least one of the output voltage and the load current at a first mode by using the AD converter, and feedbacks the information of at least one of the output voltage and the load current as an analog value at a second mode, and the control circuit switches between the first mode and the second mode based on a comparison result between a value obtained using the information of the output voltage or the load current and a predetermined threshold value, and stops a digitalization operation of the AD converter at the second mode.

2. The semiconductor integrated circuit according to claim 1, wherein the AD converter is a successive approximation register AD converter.

3. The semiconductor integrated circuit according to claim 1, wherein the AD converter is a parallel type AD converter.

4. The semiconductor integrated circuit according to claim 3, wherein the AD converter includes a plurality of comparison circuits which compares a predetermined reference voltage and a feedback voltage of the output voltage and is connected in parallel, and at least one of the comparison circuits includes:

first and second MOS transistors which compare the reference voltage and the feedback voltage and constitute a differential pair; and a third MOS transistor which supplies a current to the first and second transistors, wherein the control circuit turns off the third MOS transistor in the second mode.

5. The semiconductor integrated circuit according to claim 1, further comprising:

a drive signal generation circuit which generates a drive signal of the switching element.

6. The semiconductor integrated circuit according to claim 5, wherein the control circuit switches from the first mode to the second mode based on a comparison result between a control signal which controls duration of a High level of the drive signal and a predetermined threshold value.

7. The semiconductor integrated circuit according to claim 6, wherein the control circuit switches from the second mode to the first mode based on a comparison result between a frequency of the drive signal and a predetermined threshold value.

8. The semiconductor integrated circuit according to claim 1, wherein the feedback loop comprises:

a voltage feedback loop which compares a feedback voltage of the output voltage and a predetermined reference voltage, and outputs a control signal based on the comparison result;

a current feedback loop which feedbacks the information of the load current and outputs a feedback current signal;

a comparison circuit which compares the control signal and the feedback current signal; and a PMW signal generation circuit which generates a PMW signal in response to an output of the comparison circuit.

9. The semiconductor integrated circuit according to claim 8, wherein when the feedback current signal exceeds a predetermined threshold value, the control circuit switches from the first mode to the second mode.

10. The semiconductor integrated circuit according to claim 9, wherein upon detection of falling of the PWM signal, the control circuit switches from the second mode to the first mode.

11. A semiconductor integrated circuit, comprising:

an input terminal to which a power supply voltage is applied;

an output terminal which outputs an output voltage and a load current;

a switching element in which one end is connected to the input terminal and another end is connected to the output terminal;

a drive signal generation circuit which generates a drive signal of the switching element;

a sample hold circuit having a switch responsive to a sampling signal and a capacitor connected to the switch; wherein the switch is connected between the output terminal and the capacitor;

a comparator to which an output of the sample hold circuit and a reference signal are supplied, and outputs an output signal; and a control circuit which receives the output signal of the comparator and supplies a predetermined sampling signal to the switch of the sample hold circuit, wherein the control circuit supplies the sampling signal having a predetermined cycle to the switch of the sample hold circuit at a first mode and supplies a signal having a fixed voltage to the switch of the sample hold circuit to fix the switch of the sample hold circuit in a conduction state at a second mode.

12. The semiconductor integrated circuit according to claim 11, wherein the control circuit switches the mode from the first mode to the second mode based on a comparison result between a control signal which controls duration of a High level of the drive signal and a predetermined threshold value.

13. The semiconductor integrated circuit according to claim 12, wherein the control circuit switches from the second mode to the first mode based on a comparison result between a frequency of the drive signal and a predetermined threshold value.

14. A semiconductor integrated circuit, comprising:

an input terminal to which a power supply voltage is applied;

an output terminal which outputs an output voltage;

a switching element in which one end is connected to the input terminal and another end is connected to the output terminal;

a drive signal generation circuit which generates a drive signal of the switching element;

a control circuit which controls a ratio turning on the switching element;

a plurality of comparators each having first and second input terminals and connected in parallel, and outputs an output signal to the control circuit;

a unit supplying an information of the output voltage to the first input terminals of the plurality of comparators; and a unit supplying reference signals each having different values to the second input terminals of the plurality of comparators, wherein the control circuit operates the plurality of comparators at a first mode, and operates only one specific comparator among the plurality of comparators at a second mode.

15. The semiconductor integrated circuit according to claim 14, wherein at least one comparator among the comparators includes:

fourth and fifth MOS transistors which compare one of the reference voltages and the feedback voltage and constitute a differential pair; and a sixth MOS transistor which supplies a current to the fourth and fifth MOS transistors, wherein the control circuit turns off the sixth transistor in the second mode.

* * * * *